United States Patent [19]
Wile

[11] Patent Number: 4,588,968
[45] Date of Patent: May 13, 1986

[54] LOW NOISE CONSTANT AMPLITUDE OSCILLATOR CIRCUIT

[75] Inventor: Donald T. Wile, San Jose, Calif.

[73] Assignee: National Semiconductor Corporation, Santa Clara, Calif.

[21] Appl. No.: 580,592

[22] Filed: Feb. 16, 1984

[51] Int. Cl.$^4$ .............................................. H03L 5/00
[52] U.S. Cl. ................................ 331/109; 331/117 R; 331/183
[58] Field of Search ............ 331/109, 117 R, 117 FE, 331/167, 168, 183

[56] References Cited

U.S. PATENT DOCUMENTS 3,665,342  5/1972  Reed .................................... 331/109
3,824,491  7/1974  Treadway .......................... 331/109

Primary Examiner—Eugene R. LaRoche
Assistant Examiner—James C. Lee
Attorney, Agent, or Firm—Gail W. Woodward; Paul J. Winters; Michael J. Pollock

[57] ABSTRACT

A low noise oscillator is described suitable for use in an AM stereo radio receiver. The oscillator circuit includes means for controlling its amplitude at a constant low level. The oscillator is amenable to electronic tuning and IC construction.

4 Claims, 2 Drawing Figures

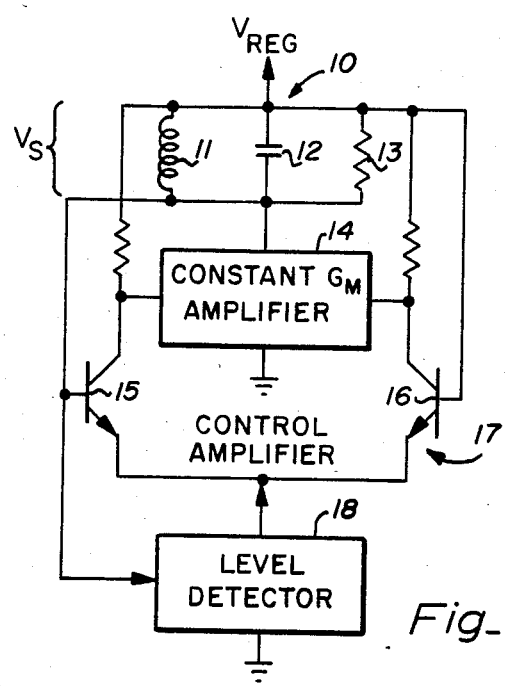
Fig_1
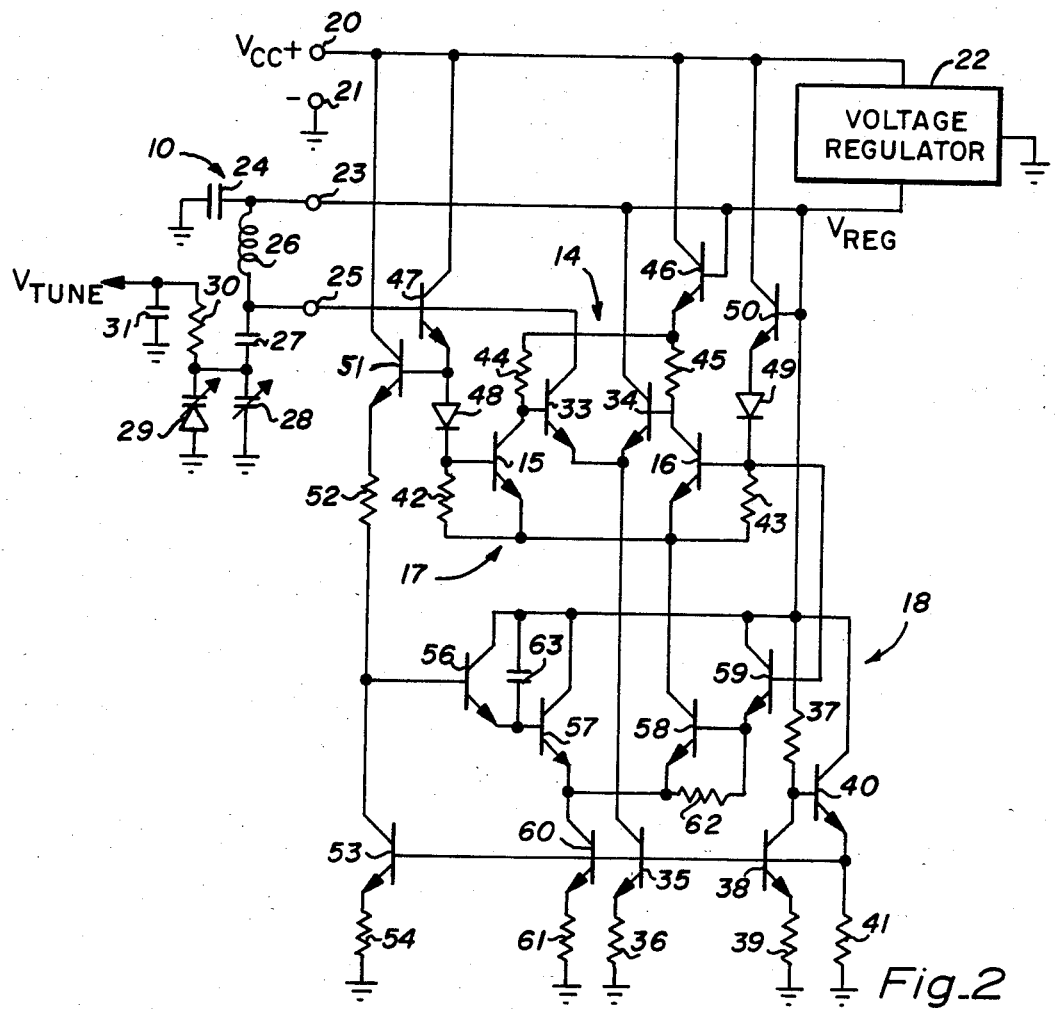
Fig_2

LOW NOISE CONSTANT AMPLITUDE OSCILLATOR CIRCUIT

BACKGROUND OF THE INVENTION

The invention relates to oscillator circuits useful in superheterodyne radio receivers. In particular the oscillator is useful in electronically tuned AM stereo receivers. In AM stereo the L+R, or sum information, is transmitted using conventional amplitude modulation. This signal is receivable on a conventional AM radio so that the stereo broadcast can be compatibly received with conventional or non-stereo receivers. The L−R, or difference information, is transmitted by phase modulation of the carrier. This signal information will be ignored in conventional receivers. In a receiver equipped with a phase decoder the L−R signal can be recovered and matrixed with the L+R signal to reproduce L and R channel signals. Since the L−R channel is sent via phase modulation the stereo receiver must not introduce any appreciable phase jitter into the received signal. This places a severe requirement on the receiver local oscillator. Any local oscillator phase jitter will appear in the L−R signal as noise.

Another point is that for any high quality superheterodyne receiver a constant local oscillator injection level is desirable. In a typical radio broadcast receiver the local oscillator is tuned over a 2:1 range. That is, the tuning range is about twice the lowest frequency. The typical oscillator amplitude will vary by about 2:1 also. This makes constant local oscillator injection quite difficult.

Still another point relates to electronic tuned radio (ETR) circuits. Varactor tuning is commonly employed to make the circuits voltage tuned. Typically three varactors are gang tuned by a single control voltage. These are the local oscillator, the mixer input, and the r-f amplifier. These circuits can be made to track adequately so long as the signal voltages are small. Since the r-f and mixer circuits normally operate at a very low level they pose no problems. However, in the local oscillator the signal can be rather large. Such a large signal can act to shift the average tuning capacitance in a varactor and thereby upset the tracking. A small and controlled amplitude local oscillator signal would be very desirable.

SUMMARY OF THE INVENTION

It is an object of the invention to provide a constant amplitude oscillator signal.

It is a further object of the invention to lower the noise in a constant amplitude oscillator.

It is a still further object of the invention to provide an ETR oscillator circuit having low noise and low and constant signal amplitude.

These and other objects are achieved in a circuit configured as follows. A conventional parallel resonant circuit is employed as the frequency determining element. This circuit is driven from a constant $G_M$ amplifier which is driven by a variable gain control amplifier. The gain control amplifier is gain controlled by a level detector having a predetermined threshold. The level detector is also connected to receive a signal from the tuned circuit. When the tuned circuit develops an output that exceeds the level detector threshold, it reduces the gain of the gain control aplifier which in turn reduces the input level to the constant $G_M$ amplifier, thereby controlling the oscillator amplitude.

The constant $G_M$ amplifier is a differential amplifier that is run at low tail current so as to minimize noise. A differential output control amplifier is coupled to the constant $G_M$ amplifier and its tail current can be varied for the gain control action. This control amplifier stage is operated in the switching mode so that its noise contribution is not significant. The control amplifier stage tail current is controlled from a level detector that has a predetermined threshold. When the oscillator output exceeds the level detector threshold, the control amplifier stage gain is reduced to limit the oscillation. Thus, the oscillator amplitude is related to the level detector threshold and is therefore constant. This also makes the oscillator amplitude an independently controllable value.

BRIEF DESCRIPTION OF THE DRAWING

FIG. 1 is a block diagram of the circuit of the invention.

FIG. 2 is a schematic diagram of a circuit useful in IC implementation of the invention.

DESCRIPTION OF THE INVENTION

FIG. 1 is a simplified block diagram of the circuit of the invention with some schematic symbols to complete the functions. A tank circuit 10 is shown made up of an inductor 11 in parallel with capacitor 12 and resistor 13. The circuit is antiresonant at the desired frequency and resistor 13 represents the maximum circuit impedance at resonance. Its value determines the Q of the tank circuit. Desirably for good oscillator performance the a-c signal voltage across the tank, $V_S$, is kept small for several reasons. First by keeping the $V_S$ small tuning varactor performance is improved. Also oscillator radiation is reduced.

Constant $G_M$ amplifier 14 drives the tank 10 and is in turn driven by transistors 15 and 16 which together comprise a control amplifier 17. A level detector 18 has its input coupled to sense the voltage tank across tank 10 and operates to provide the tail current of control amplifier 17. The actions of constant $G_M$ amplifier 14 and control amplifier 17 combine to cause the tank circuit to oscillate at antiresonance. Initially, as the a-c signal voltage across tank 10 rises, the level detector 18 acts to reduce the gain of control amplifier 17 so as to limit the oscillation. Thus, as tank 10 is tuned by varying its component values its output voltage, $V_S$, is held constant. By controlling the threshold of level detector 18, the oscillator voltage, $V_S$, is determined.

The schematic diagram of FIG. 2 illustrates a suitable IC for practicing the invention. The circuit is operated from a $V_{CC}$ power supply connected between + terminal 20 and ground or − terminal 21. A conventional voltage regulator 22 provides a regulated voltage at chip terminal 23. Off chip capacitor 24 bypasses terminal 23 to ground at signal frequencies. Terminal 25 is the tank terminal and inductor 26 is connected between terminals 23 and 25. Capacitors 27 and 28 along with varactor 29 tune inductor 26 to the desired frequency. Resistor 30 returns varactor 29 to a source of tuning voltage which is bypassed to ground by capacitor 31. Thus, the circuit is electronically voltage tuned. In the following discussion the transistors are all conventional NPN devices having typical Beta values of 50 or more. For the purpose of the discussion the transistor base currents, which are less than 2% of the collector currents, will be neglected.

Transistors 33 and 34 are connected as a differential constant $G_M$ amplifier 14 that drives tank 10. Their emitter current flows in transistor 35 and resistor 36. Resistor 37 passes a current that flows in current mirror transistor 38 and resistor 39. Transistor 40 is connected as an emitter follower with load resistor 41 so that transistor 38 is forced to act as a diode. The values of resistors 39 and 36 are ratioed so that the tail current flowing in transistors 33 and 34 is suitably low. This reduces oscillator noise to a very low value.

Transistors 15 and 16 act as a control amplifier 17 that directly drives the bases of transistors 33 and 34 differentially. Resistors 42 and 43 respectively shunt the base-emitter circuits of transistors 15 and 16. The load resistors 44 and 45 are made relatively small and are returned to a voltage supply pin at one $V_{BE}$ below the regulated voltage line by the action of the level shift in emitter follower transistor 46. This control amplifier has low gain that can be controlled by its tail current.

An emitter follower transistor buffer 47 has its input coupled to tank 10 so as to sense the signal voltage. Its output is coupled via level shift diode 48 to the base of transistor 15. Level shift diode 49 and emitter follower transistor 50 balance the base voltage of transistor 16. Thus, the d-c conditions of transistors 15 and 16 are matched. However, transistor 15 acts as a phase inverting amplifier that couples tank 10 back to constant $G_M$ amplifier transistor 33, thus providing positive feedback for oscillator action.

The base of transistor 16 is operated at a d-c reference at two $V_{BE}$ below $V_{REF}$ while the base of transistor 15 is at the same d-c level but has an a-c drive that is the tank 10 output.

Transistor 51 is connected as an emitter follower buffer that receives the output of transistor 46 and the output of transistor 51 is coupled to resistor 52. The current flowing in resistor 52 is set by transistor 53 and resistor 54. Transistor 53 has its base coupled to mirror transistor 38. As will be determined by the values of resistors 52 and 54, to be described in an example below, a 200 mV drop is developed across resistor 52. This will produce an oscillator peak voltage of 200 mV as will now be shown.

Transistors 57 and 58 form a high gain differential amplifier the tail current of which flows in transistor 60 and resistor 61. Resistor 62 is present to reduce the emitter resistance of transistor 59 and thereby increase amplifier gain. Resistor 61 and transistor 60 are selected so that the amplifier tail current is a suitable multiple of the current flowing in transistor 38. This amplifier in conjunction with transistors 56 and 59 along with capacitor 63 form level detector 18. A fraction of the collector current of transistor 58 is the tail current of transistors 15 and 16 which form control amplifier 17. Capacitor 63 converts transistor 56 to a peak rectifier so that the level detector 18 senses the peak oscillator input signal. One input of the differential amplifier is returned to the base of transistor 16, thus providing a stable reference and a negative feedback loop. The other input is coupled via resistor 52 to emitter follower buffer 51, which has the oscillator signal at its emitter.

In the absence of oscillation it can be seen that the base of transistor 56 will be 200 mV below the base of transistor 59. This differential will substantially turn off transistor 57 so that most of the current in transistor 60 will flow in transistor 58. For this condition the control amplifier 17 will be at maximum gain. Since this bias condition will represent the circuit operation before the oscillator has started it can be seen that reliable oscillator starting is promoted because of the high gain in the control amplifier.

Once the oscillator starts transistor 56 becomes a peak rectifier and its emitter will be pulled up so as to turn transistor 57 on. This will reduce the current in transistor 58 and the gain of control amplifier 17 will be reduced. The oscillation level will rise until the reduced control amplifier gain falls off enough to prevent further level rise. Thus, the oscillation level will be limited and held constant. Typically this level will be close to that level where the peak oscillator voltage equals the d-c drop across resistor 52. At this level a significant portion of the current flowing in transistor 60 will flow in transistor 58. For this equilibrium condition, level detector 18 is operating at its maximum gain so that good level control is present. Resistors 42 and 43 insure that level detector 18 will operate in its high gain region of operation over a large range of tank impedance by forcing transistor 58 to pass additional current supplied by these resistors. The tail current of transistors 15 and 16 is a small percentage of the total current through transistor 58. Consequently, a change in the tail current of transistors 15 and 16 at equilibrium, resulting from a change in the tank impedance, will only cause a small change in the total current of transistor 58 which implies only a small change at the input to the level detector which implies only a small change in the AC level across the tank circuit 10. Thus, resistors 42 and 43 increase the loop gain of the level detector 18 and thereby help to hold the signal level across the tank 10 at a more constant level over a wide range of tank impedance.

In the oscillatory mode transistors 15 and 16 operate at low gain and are in effect switching alternately so they too do not contribute much noise to the oscillator. The final result is a very low noise oscillator that operates at a low and very constant signal level. It can be electronically tuned over a substantial frequency range.

EXAMPLE

The circuit of FIG. 2 was fabricated in the form of conventional junction isolated monolithic IC components. The transistors were of NPN vertical construction which produced Beta values in excess of 50. Transistor 60 was made to have about six times the area of transistor 38. $V_{REG}$ was 5.6 volts and the $V_{CC}$ value was 7 to 16 volts. The following component values were used.

| COMPONENT | VALUE | UNITS |
|---|---|---|
| Capacitor 24 | 10 | Microfarads |
| Inductor 26 | 110 | Microhenries |
| Capacitor 27 | 470 | Picofarads |
| Capacitor 28 | 2 to 20 | Picofarads |
| Varactor 29 | KV1Z35Z | Toko America, Inc. |
| Resistor 30 | 150K | Ohms |
| Capacitor 31 | 1 | Microfarad |
| Resistor 36 | 5.2K | Ohms |
| Resistor 37 | 37K | Ohms |
| Resistor 39 | 1K | Ohms |
| Resistor 41 | 11K | Ohms |
| Resistor 42 | 5K | Ohms |
| Resistor 43 | 5K | Ohms |
| Resistor 44 | 100 | Ohms |
| Resistor 45 | 100 | Ohms |
| Resistor 52 | 1K | Ohms |
| Resistor 54 | 410 | Ohms |

-continued

| COMPONENT | VALUE | UNITS |
| --- | --- | --- |
| Resistor 61 | 100 | Ohms |
| Resistor 62 | 7K | Ohms |
| Capacitor 63 | 15 | Picofarads |

The circuit operated over the standard broadcast band, as an ETR local oscillator, with changes in the value of tuning voltage. The oscillator amplitude was 200 peak millivolts ±10 mV. The oscillator output noise was so low that the noise produced by varactor 29 dominated the system. This noise level proved to be suitably low so that AM stereo reception was not adversely noise degraded.

The circuit of the invention has been described and a working example detailed. When a person skilled in the art reads the above description, alternatives and equivalents, within the spirit and intent of the invention, will become apparent. Accordingly, it is intended that the scope of the invention be limited only by the following claims.

I claim:

1. An oscillator circuit comprising:
   a tank circuit;
   variable gain amplifier means comprising a constant $G_M$ differential amplifier driven from a variable gain differential control amplifier, said variable gain amplifier means having an output coupled to drive said tank circuit, a gain control input, and a signal input;
   means for coupling said tank circuit to said signal input whereby said tank circuit is caused to oscillate;
   level detector means, including a peak rectifier responsive to the peak level of the signal on said tank circuit, coupled to sense said tank circuit oscillation and having an output coupled to said gain control input; and
   means for providing a threshold level for the peak rectifier whereby said threshold level determines the amplitude of the oscillator signal and said tank circuit oscillates at constant amplitude.

2. The circuit of claim 1 wherein said variable gain differential control amplifier comprises:
   a pair of transistors each having an emitter, a base, and a collector;
   means coupling said emitters together to comprise said gain control input;
   means coupling said collectors of said transistors to the differential input of said constant $G_M$ differential amplifier and to low value load resistors; and
   resistor means coupled in parallel with the emitter-base paths of said pair of transistors whereby the tail current of said pair of transistors constitutes a fraction of the current flowing in said gain control input and the gain control response is thereby increased.

3. The circuit of claim 1 wherein said level detector comprises a high gain differential amplifier having an output coupled to supply the tail current for said control amplifier, one input coupled to a d-c reference potential and the other input coupled to receive the signal from said tank circuit.

4. The circuit of claim 3 wherein said peak rectifier is associated with said other input of said high gain differential amplifier.

* * * * *